United States Patent [19]
Kasha et al.

[11] Patent Number: 5,412,348
[45] Date of Patent: May 2, 1995

[54] COMPOUND TRIPLE CASCODED MIRROR

[75] Inventors: Dan B. Kasha; Donald A. Kerth, both of Austin, Tex.

[73] Assignee: Crystal Semiconductor, Inc., Austin, Tex.

[21] Appl. No.: 87,842

[22] Filed: Jul. 1, 1993

[51] Int. Cl.[6] ............................................. H03F 3/16
[52] U.S. Cl. ................................. 330/288; 330/310
[58] Field of Search ................. 330/9, 277, 288, 310

[56] References Cited

U.S. PATENT DOCUMENTS

| | | | |
|---|---|---|---|
| 4,697,154 | 9/1987 | Kousaka | 330/277 |
| 5,146,179 | 9/1992 | Carley | 330/277 |

FOREIGN PATENT DOCUMENTS

0184909  8/1986  Japan .................. 330/288

*Primary Examiner*—Steven Mottola
*Assistant Examiner*—Tiep H. Nguyen
*Attorney, Agent, or Firm*—Gregory M. Howison

[57] ABSTRACT

A triple cascoded mirror active load includes three transistors (20), (26) and (28) in a first leg and three transistors (22), (30) and (34) in an output leg connected to an output node (18). The first leg receives a current on an input node (14) on the drain of transistor (20). Transistor (20) has the gate thereof connected to the drain of transistor (26) with the gates of transistors (24) and (30) connected together and to a bias voltage. Transistor (20) is mirrored to transistor (22) by connecting the gates thereof together. Similarly, the gates of transistors (28) and (34) are connected together and also to the node (14). In this manner, the node (14) receives a low impedance on the input thereto, whereas the gate of transistor (22) sees a high impedance thereto and with only two transistors, transistors 26 and 28, disposed in a loop as a ratioed cascoded configuration.

10 Claims, 5 Drawing Sheets

COMPOUND TRIPLE CASCODED MIRROR

TECHNICAL FIELD OF THE INVENTION

The present invention pertains in general to cascoded mirrors, and more particularly to a compound cascoded mirror.

BACKGROUND OF THE INVENTION

Simple differential amplifiers with relatively straightforward output active loads are typically configured with two N-channel devices having the source/drains thereof connected between respective differential outputs and ground. The gates of the two N-channel transistors are connected to a separate bias voltage, which bias voltage can be generated at any desired voltage with a separate circuit. For a single ended output voltage, a simple differential amplifier with an active load provides the bias voltage by connecting the drain and gate of one of the N-channel transistors together, the drain of the other N-channel transistor providing the single ended output. In this manner, the current in the transistor having the drain and gate connected together is mirrored over to the other N-channel transistor, the gates being common. In order for their to be proper operation of this active load, the currents in the two N-channel transistors must mirror each other and the drain impedance of the one transistor having the drain and gate connected together must be low, and the drain impedance on the output must be high. For the simple active load, an N-channel transistor having the gate and drain tied together in a diode-connected configuration is by definition operating in the saturated region and, therefore, the current mirror formed by the two N-channel transistors will work properly.

In a ratioed cascoded load, an additional N-channel transistor is disposed in series with the drain of the diode-connected N-channel transistor such that the diode connection occurs between the drain of the additional N-channel transistor and the gate of the original N-channel transistor. A similar configuration is incorporated in the output leg wherein an additional N-channel transistor is incorporated in series with the drain of the original N-channel transistor in the output leg. Both of the additional transistors have the gates thereof connected to a bias voltage. With careful choice of the device sizes in this type of configuration, the two transistors in the diode-configured side of the mirror can be operated in the saturated region. However, when utilizing a triple cascoded configuration, this method has difficulties. In this configuration, a level shift circuit is typically utilized. However, this level shift circuit can cause problems, such as additional power draw, overall output voltage swing, and stability problems.

SUMMARY OF THE INVENTION

The present invention disclosed and claimed herein comprises a cascoded active load for a differential-to-single-ended output. The active load includes a ground node, a first input current node and a second input current node. The second input current node provides the voltage output node for the amplifier. A first cascoded leg is disposed between the first input current node and the ground node, and a second output leg is disposed between the second input current node and the ground node. The first cascoded leg includes n transistors arranged with the source/drain paths thereof connected in a series configuration. The gates of each of the n transistors are connected to the drains of one of the transistors at a higher voltage or to a separate and dedicated external bias voltage for that transistor, such that each of the transistors operates in a saturated region. At least two of the n transistors are connected in a single ratioed cascode configuration with the gate of one of the transistors therein connected to the drain of the other of the transistors therein, and the gates of the other of the transistors therein connected to the separate and external bias voltage. No more than two of the transistors are connected in a single ratioed cascode configuration. The second output leg includes n transistors arranged with the source/drain paths thereof connected in a series configuration and each of the n transistors therein corresponding to each of the n transistors in the first cascoded leg relative to the position therein. Each of the n transistors in the second output leg has the gate thereof connected to the gate of the corresponding one of the n transistors in the first cascoded leg.

In another aspect of the present invention, the value of n is equal to three. The ratioed cascode configuration is disposed in the series arrangement of the three transistors such that the ratioed cascode transistors comprise the two lowest voltage transistors for the n-channel configuration. Of course, the same will apply to a p-channel configuration with the exception that it will be the two highest voltage transistors. The third transistor at the highest voltage has the gate and drain thereof connected together in a diode configuration with the drain connected to the first input current node.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
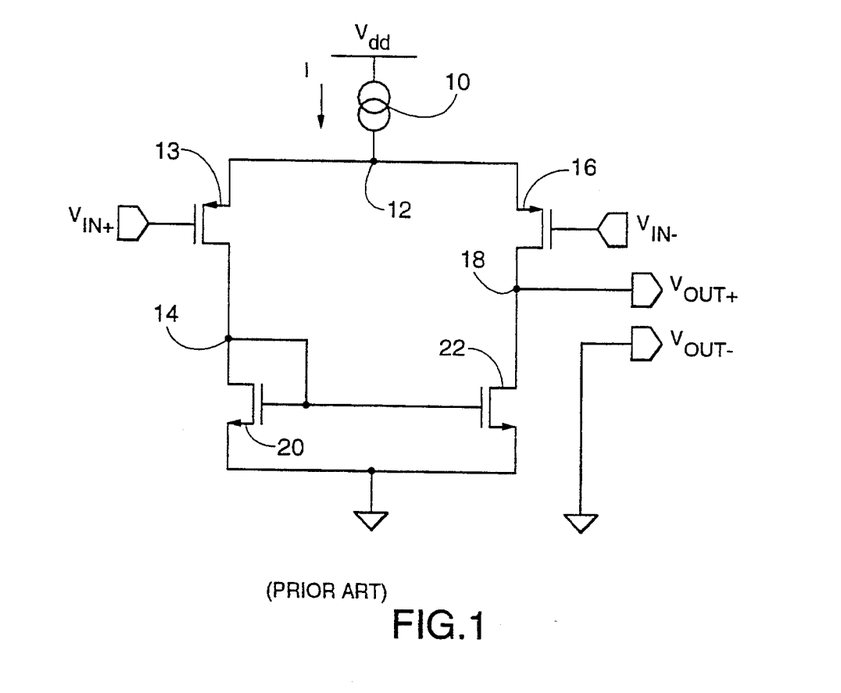
FIG. 1 illustrates a schematic diagram of a prior art differential amplifier with a single ended output and active load.

Referring now to FIG. 1, there is illustrated a prior art single ended differential amplifier having active loads. A current source 10 is connected between $V_{dd}$ and a node 12. A first P-channel transistor 13 has the source/drain path thereof connected between node 12 and a node 14, and a P-channel transistor 16 has the source/drain path thereof connected between the node 12 and an output node 18. The gates of transistors 13 and 16 are connected to a differential input voltage. The node 14 is connected through the source/drain path of an N-channel transistor 20 to ground and the gate thereof is connected to the node 14. An N-channel transistor 22 has the source/drain path thereof connected between the node 18 and ground and the gate thereof connected to the node 14. The bias voltage for transistors 20 and 22 is produced by the connection of the drain to the gate of the transistor 20, such that the current in transistor 20 will be properly mirrored in transistor 22. The three requirements for proper operation of this active load are that the currents in transistors 20 and 22 mirror each other, that the impedance seen at the drain of transistor 20 is low and that the impedance seen at the drain of transistor 22 is high. By definition, the transistor 20 operates in the saturated region and the current mirror formed by transistors 20 and 22 will work properly.

If the structure of FIG. 1 were configured in a ratioed cascoded configuration, an N-channel transistor would be disposed between the drain of transistor 20 and the node 14 and an N-channel transistor would be connected between the drain of transistor 22 and the node 18. In this configuration, the minimum output voltage on node 18 would be the sum of the drain-to-source voltages of the two series connected transistors necessary to keep the transistors saturated. This minimum voltage is:

$$V = 2V_{gs} - 2V_T \qquad (1)$$

where $V_{gs}$ is the gate-to-source voltage; and
$V_T$ is the threshold voltage of the transistor.
For simplicity purposes, this does not take into account the effects of velocity saturation.

Figure 2:
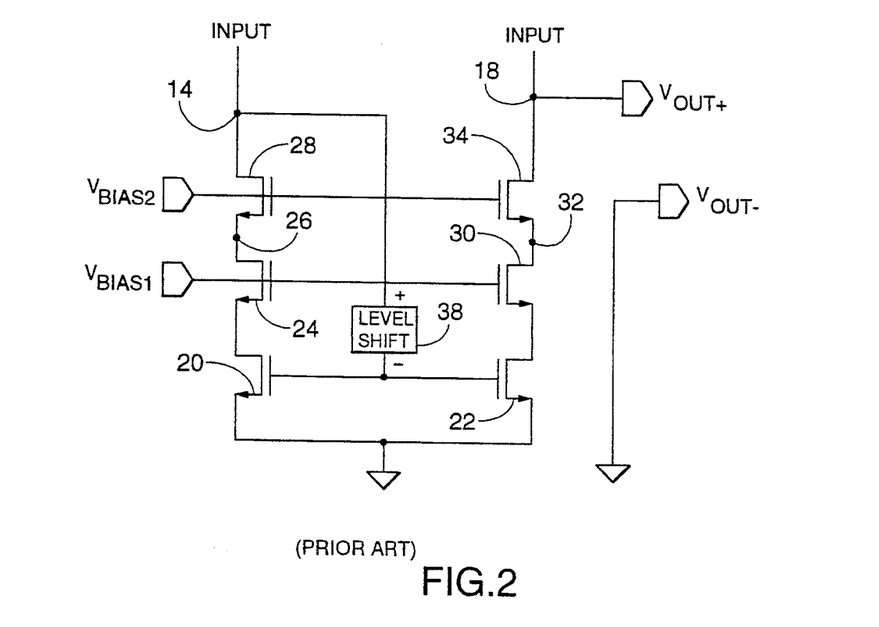
FIG. 2 illustrates a schematic diagram of a prior art triple cascoded active load for the differential amplifier with a single output.

Referring now to FIG. 2, there is illustrated a prior art triple cascoded active output load for a single ended output amplifier. In this triple cascoded configuration, an N-channel transistor 24 has the source/drain path thereof connected between a node 26 and the drain of the transistor 20. An N-channel transistor 28 has the source/drain path thereof connected between the node 14 and the node 26. An N-channel transistor 30 has a source/drain path thereof connected between a node 32 and the drain of transistor 22 and an N-channel transistor 34 has a source/drain path thereof connected between the node 18 and the node 32. The gates of transistors 24 and 30 are connected to a voltage $V_{bias1}$ and the gates of transistors 28 and 34 are connected to a bias voltage $V_{bias2}$. This provides a ratioed cascode configuration.

For the triple cascoded configuration of the active load to operate correctly, a simple wire connection between the gate of transistor 20 and the node 14 will not properly bias the mirror load for many practical device sizes over all operating points. Typically, a level shift network 38 is needed to introduce enough voltage head room for all devices in the load. This properly biases all load devices in the triple cascode amplifier. The level shift network 38 is connected between the gate of transistor 20 and the node 14 to provide a minimum level shift for proper operation.

For each device in the triple cascoded active load of FIG. 2, the drain-to-source voltage necessary to keep the device active is as follows:

$$V_{ds} = V_{gs} - V_t = V_{ON} \qquad (2)$$

and the level shift required is:

$$V_{ls} = V_{ON2} V_{ON3} - V_{t1} \qquad (3)$$

where $V_{ON2}$ is the saturation voltage of the second level transistor, transistor 24, and $V_{ON3}$ is the saturation voltage of the third level transistor, transistor 28. The voltage on the gate of transistor 20 is the gate-to-source voltage which is the sum of the saturation voltage $V_{ON1}$ of the first level transistor, transistor 20, and the threshold voltage thereof, $V_{t1}$, at the first level. The voltage on the gate of the transistor 24 is the sum of the saturation voltage of transistor 20, $V_{ON1}$, and the gate-to-source voltage of transistor 24, which is the sum of the saturation voltage, $V_{ON2}$, and the threshold voltage of transistor 24, $V_{t2}$. The voltage on the gate of transistor 28 is the sum of the saturation voltage, $V_{ON1}$ of transistor 20, the saturation voltage of transistor 24, $V_{ON2}$, and the gate-to-source voltage of transistor 28, which is the sum of its saturation voltage $V_{ON3}$ and its threshold voltage $V_{t3}$.

Several problems exist with the circuit of FIG. 2. The level shift can be rather difficult to produce in such a way that the level shift is adequate over all variations of process and temperature. One major factor is that the voltage $V_{ON}$ for each device may be different, due to the size chosen (often decided by constraints, such as noise, output swing optimization and area restrictions). Also, the threshold voltage of the transistors, $V_t$, varies according to the source voltage, which is different for each transistor 20, 24, and 28. Finding a level shift circuit to track variation of these parameters becomes very difficult.

Figure 3:
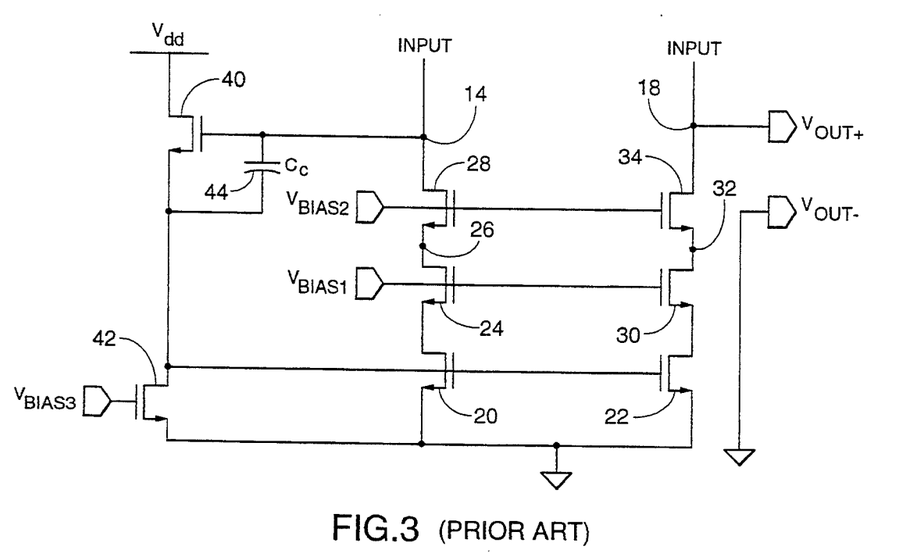
FIG. 3 illustrates a more detailed schematic diagram of the device of FIG. 2.

Referring now to FIG. 3, there is illustrated a schematic diagram of the prior art structure of FIG. 2 illustrating one embodiment of a level shift network, which is realized with a source follower. An N-channel transistor 40 has a source/drain path thereof connected between $V_{dd}$ and the gate of the transistor 20. The gate of transistor 40 is connected to the node 14. An N-channel transistor 42 has the source/drain thereof connected between the gate of transistor 20 and ground, the gate thereof connected to a voltage $V_{bias3}$. A capacitor 44 is connected between node 14 and the gate of transistor 20. The transistor 42 functions as a current source to bias the source follower transistor 40, whose gate-to-source voltage acts as a level shift. One obvious problem with the circuit is the additional current drawn by the follower. Additionally, a stability problem exists with this level shift circuit, caused by the feedback loop from the gate of transistor 20 to the drain of transistor 28, and back through the source follower transistor 40. The response from the gate of transistor 20 to the drain of transistor 28 has a unity gain bandwidth that is comparable to the pole frequency of the source follower transistor 40. When the source follower transistor 40 is introduced, the response of the feedback loop can be significantly degraded. To improve the stability, the zero frequency of the source follower transistor 40 may be decreased with the compensation capacitor 44. However, even if the follower did not introduce any additional frequency dependence, the response from the gate of transistor 20 to the gate of transistor 28 may be inadequate, affecting the overall amplifier stability.

Figure 4:
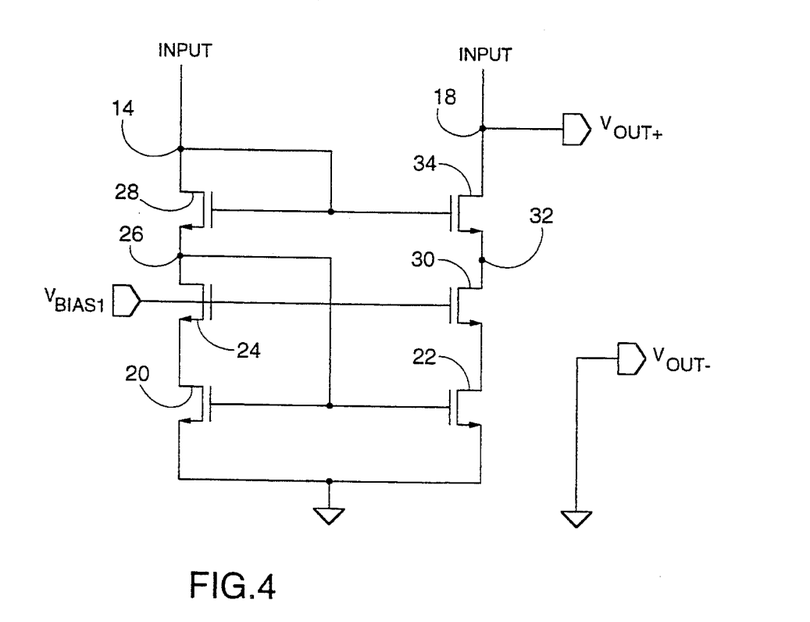
FIG. 4 illustrates a schematic diagram of the triple cascoded active load of the present invention for a differential amplifier with a single ended output.

Referring now to FIG. 4, there is illustrated the preferred embodiment of the triple cascoded active load. In the configuration of FIG. 4, the gate of transistor 20 is connected to the node 26 and the gate of transistor 28 is connected to the node 14. This provides a first two transistor ratioed cascode circuit with a single cascode transistor added thereto. Only the gates of transistors 24 and 30 are connected to the bias voltage $V_{bias}$, whereas the gate of transistor 34 is connected to the gate of transistor 28 and, subsequently, to the node 14. As will be described hereinbelow, this embodiment properly biases the triple cascoded mirror load, while providing a large output swing and excellent stability. The connection from the drain of transistor 24 on the node 26 to the gate of transistor 20 can be made with these devices in the proper region of operation and with the proper bias voltage $V_{bias}$, at the gate of the transistor 24. This bias voltage is not part of the mirror feedback loop (therefore not degrading stability) and can be easily generated in such a way that it will track the properties of transistors 20 and 24. The voltage $V_{bias}$ must be at least at a voltage level equal to the sum of the saturation voltage of transistor 20 and the gate-to-source voltage of transistor 24, such that both transistors 20 and 24 operate in the saturation region. The threshold voltage of transistor 20 must be greater than the saturation voltage of transistor 24. The connection from the drain of transistor 28 at node 14 to the gate thereof properly biases transistor 28 and satisfies the requirement that the impedance seen looking into the drain of transistor 28 is low.

The minimum output voltage of the circuit of FIG. 4 is equal to the gate voltage of transistor 34 minus the threshold voltage of transistor 34. Since the gate voltage of transistor 34 is the same as transistor 28, then it is the difference between the gate voltage of transistor 28 and the threshold voltage of transistor 34. The gate voltage of transistor 28, $V_{G31}$, is the sum of the gate voltage of transistor 20, the threshold voltage of transistor 28 and the saturation voltage of transistor 28 or:

$$V_{G3} = V_{ON1} + V_{t1} + V_{ON3} + V_{t3} \quad (4)$$

Since the transistors 28 and 34 match and the threshold voltage of transistor 34 is substantially equal to the threshold voltage of transistor 28, the output voltage $V_{o(min)}$ is:

$$V_{o(min)} = V_{ON1} + V_{t1} + V_{ON3} \quad (5)$$

which, if transistors 28 and 20 are substantially the same size, is equal to twice the $V_{ON}$ voltage plus the threshold voltage $V_t$.

The absolute lowest output voltage, $V_{O(ABS)}$, that can be achieved by a triple cascode load is:

$$V_{O(ABS)} = V_{ON1} + V_{ON2} V_{ON3} \quad (6)$$

In the bias scheme of the present invention illustrated in FIG. 4, the threshold voltage, $V_{t1}$, must be greater than the drain-to-source voltage $V_{ON2}$ of transistor 24 for proper biasing, but the threshold voltage $V_{t1}$ can be rather low, since it is the threshold voltage with zero source-to-substrate potential, since the sources of transistors 20 and 22 are the most negative voltages in the circuit. Therefore, the minimum output voltage of the circuit of FIG. 4 is not much greater than the best that can be achieved by a triple cascoded load. This is achieved by permitting no more than two transistors to be incorporated into the ratioed cascode configuration, and no less than two transistors.

Figure 5:
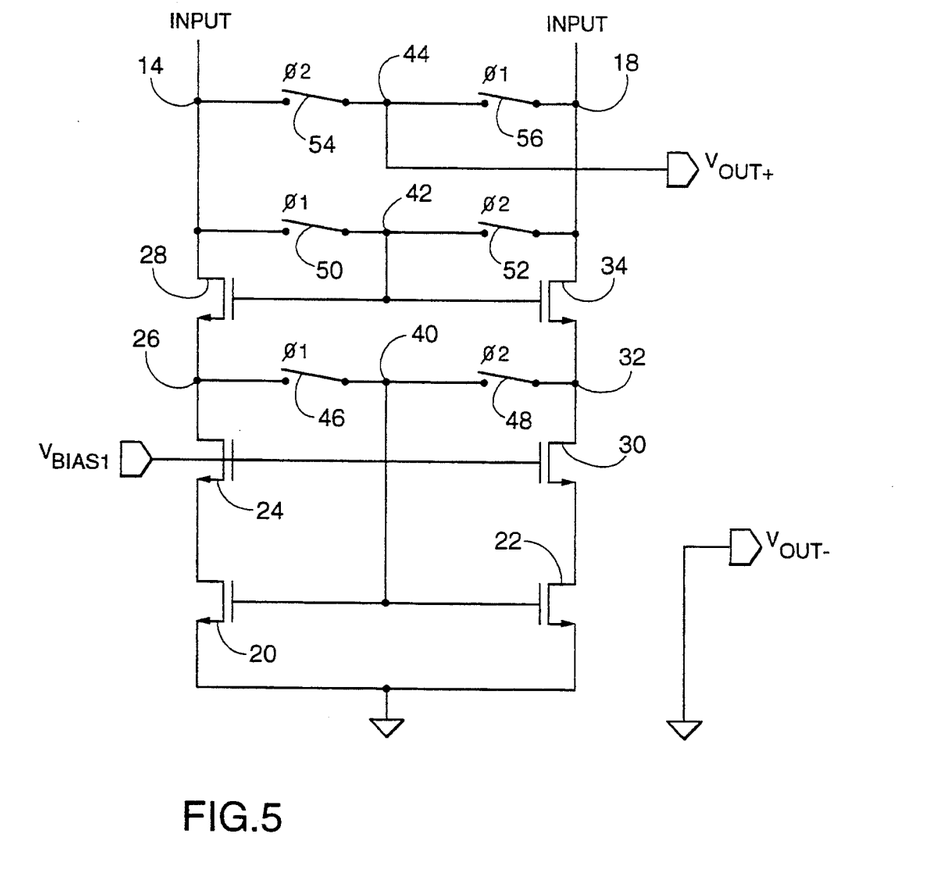
FIG. 5 illustrates a chopper stabilized version of the circuit of FIG. 4.

Referring now to FIG. 5, there is illustrated the circuit of FIG. 4, configured in a chopper stabilized circuit. In this configuration, the gates of transistors 20 and 22 are connected together and to an intermediate node 40, which is alternately connected between nodes 26 and 32 to reverse the current mirror operation. Additionally, the gates of transistors 28 and 34 are connected to an intermediate node 42 and are connected to either the node 14 or the node 18 in an alternating fashion. Similarly, the node 18 and the node 14 are alternately connected to an intermediate output node 44. The node 40 is connected to the node 26 through a switch 46, which is controlled by a $\phi 1$ signal. The node 40 is connected to the node 32 by a switch 48, which is controlled by a $\phi 2$ signal. The node 42 is connected to a node 14 by a switch 50, which is controlled by the $\phi 1$ signal. The node 42 is connected to the node 18 by a switch 52, which is controlled by the $\phi 2$ signal. The node 44 is connected to the node 14 through a switch 54, which is controlled by the signal $\phi 2$ signal. Node 44 is connected to the node 18 through a switch 56, which is controlled by the $\phi 1$ signal.

As is well-known in the art, chopper stabilization is a technique that eliminates the offset voltage (non-zero input voltages required to sustain a zero output level) and low-frequency noise by converting it to a high frequency signal that can be separated (filtered) from the signal at the output. This chopper stabilization is achieved by changing the polarity of the input to the amplifier at a higher frequency ($f_{CHOP}$) and, at the same rate, changing the polarity of the output of the amplifier such that at any time the proper amplification polarity is maintained. The output offset resulting from the chopper stabilized amplifier changes at a rate $f_{CHOP}$ from a positive to a negative voltage, while the input signal remains unaffected. The high frequency tones resulting from the offset of the amplifier can be easily filtered. Low frequency noise generated within the amplifier can be viewed simply as an offset voltage that changes slowly, and it will also be converted in the same manner near $f_{CHOP}$ that can be filtered out. For a single ended output amplifier with a current mirror load, bias connection and the output location must be changed in each cycle.

Figure 6:
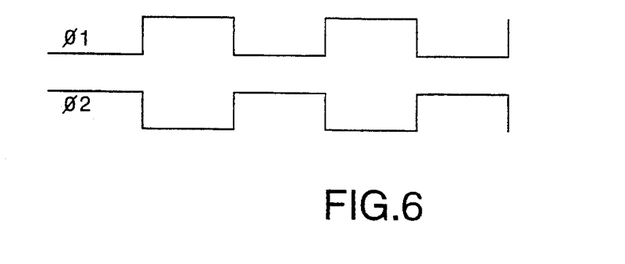
FIG. 6 illustrates timing diagrams for the chopper stabilized circuit of FIG. 5.

Referring now to FIG. 6, there is illustrated a timing diagram for the waveforms for signals $\phi 1$ and $\phi 2$. With reference to both FIG. 6 and FIG. 5, it can be seen that when the $\phi 1$ switches 46, 50 and 56 are closed and the $\phi 2$ switches 48, 52 and 54 are open, and the circuit is then electrically identical to the circuit of FIG. 4. In the second chop phase, the $\phi 1$ switches 46, 50 and 56 are open and the $\phi 2$ switches 48, 52 and 54 are closed which form a mirror image of FIG. 4. This $\phi 2$ phase inverts the polarity of the output required for chopper stabilization. In the circuit, six switches are required to chopper stabilize the amplifier. This will, therefore, require two additional switches over that required for a conventional differential output or single ended output chopper stabilized amplifier, that being four switches. These additional switches above the minimum switches let the improved load be utilized with chopper stabilization. The use of a greater than the minimum number of switches allows other loads to be used as well, such as a gain boosted cascode stage, which is described in B. J. Hosticka, "Improvements of Gain of MOS Amplifiers", IEEE J. Solid State Circuits, SC-14, Dec. 1979, which reference is incorporated herein by reference.

Figures 7, 8:
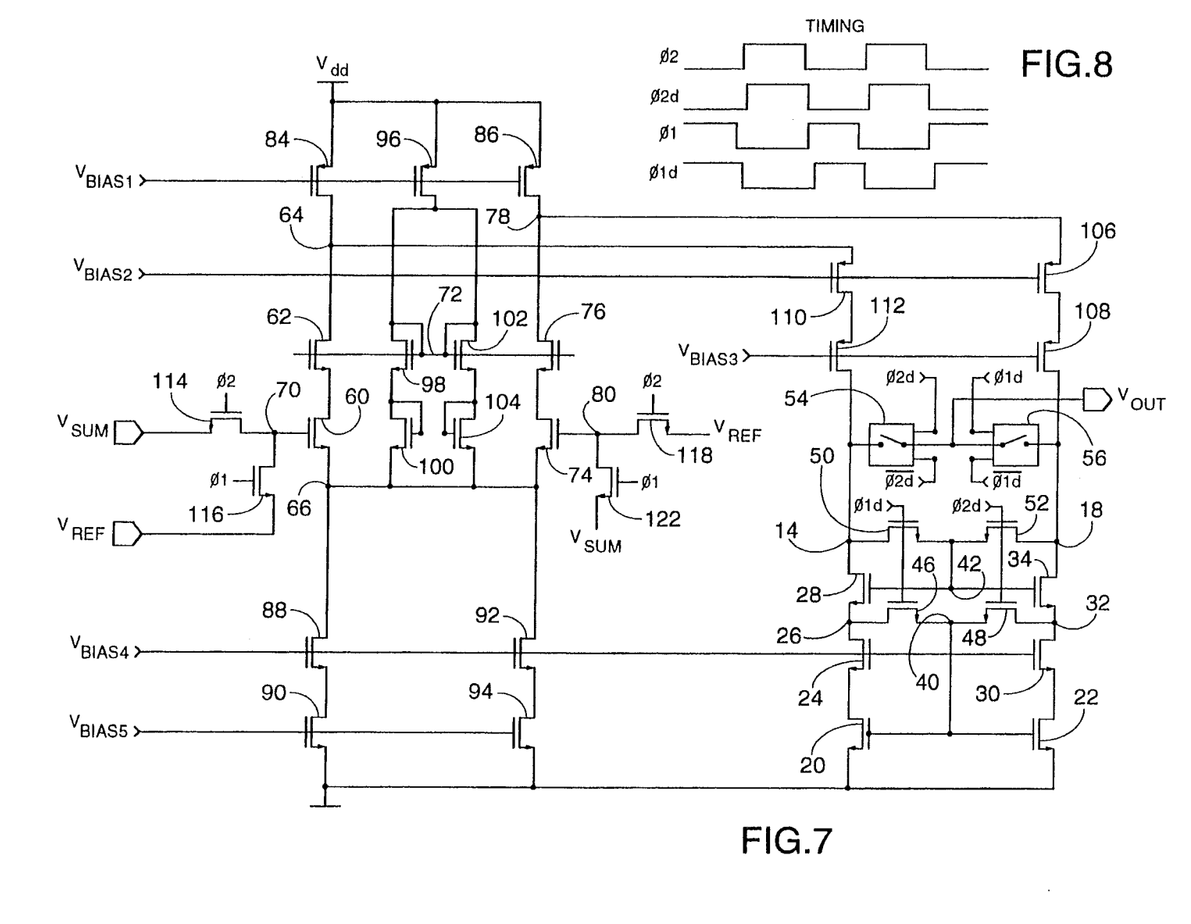
FIG. 7 illustrates a complete chopper stabilized differential amplifier incorporating the chopper stabilized output load of FIG. 5.
FIG. 8 illustrates timing diagrams for the chopper stabilized operation for the circuit of FIG. 7.

Referring now to FIG. 7, there is illustrated a schematic diagram of a folded triple cascoded chopper stabilized amplifier design that utilizes the biasing method described above with respect to FIG. 5. In the structure of FIG. 7, the switches 46, 48, 50 and 52 are realized with N-channel transistors. The switches 54 and 56 are realized with transmission gates. Two input voltages are provided, $V_{sum}$ and $V_{ref}$. A differential structure is provided with two series-connected N-channel transistors 60 and 62 connected between a node 64 and a node 66. The gate of transistor 60 is connected to a node 70 and the gate of transistor 62 is connected to a node 72. The other side of the differential structure is comprised of two series-connected N-channel transistors 74 and 76 connected between a node 78 and the node 66. The gate of transistor 74 is connected to a node 80 and the gate of transistor 76 is connected to the node 72. Node 64 is connected through the source/drain path of a P-channel transistor 84 to $V_{dd}$, the gate thereof connected to a bias voltage $V_{bias1}$. The node 78 is connected to the source/drain path of a P-channel transistor 86 to $V_{dd}$, the gate thereof connected to the voltage $V_{bias1}$. Similarly, node 66 is connected through two current source devices each comprised of two N-channel transistors 88 and 90 and two N-channel transistors 92 and 94, series connected transistors 88 and 90 connected between the node 66 and ground and series connected transistors 92 and 94 connected between node 66 and ground. The gates of transistors 88 and 92 are tied together and to a voltage $V_{bias4}$, this also being connected to the gates of transistors 24 and 30. The gates of transistors 90 and 94 are connected to a voltage $V_{bias5}$. The node 72 is connected through the source/drain path of a p-channel transistor 96 to $V_{dd}$. Two sets of series-connected N-channel transistors are provided that are connected between the node 72 and the node 66. The first set is comprised of N-channel transistors 98 and 100 and the second set is comprised of series-connected transistors 102 and 104. The transistors 100 and 104 are diode-connected with the gates thereof connected to the drains thereof and the gates of transistors 98 and 102 are connected to the respective drains thereof and to the node 72.

The node 78 is an output node of the differential structure and is connected through two series-connected P-channel transistors 106 and 108 to the node 18. Similarly, node 64 functions as an output node and is connected through the source/drain path of two series-connected P-channel transistors 110 and 112 to the node 14. The gates of transistors 110 and 106 are connected to a bias voltage $V_{bias2}$ and the gates of transistors 112 and 108 are connected to a bias voltage $V_{bias3}$.

The voltage $V_{sum}$ is connected to one side of the source/drain path of a transistor 114, the other side thereof connected to node 70 and the gate thereof connected to the $\phi2$ signal. The voltage $V_{ref}$ is connected through the source/drain path of the transistor 116 to the node 70, the gate thereof connected to the $\phi1$ signal. The voltage $V_{ref}$ is also connected through the source/drain path of a transistor 118 to the node 80, the gate thereof connected to the $\phi2$ signal. The voltage $V_{sum}$ is also connected through the source/drain path of a transistor 122 to the node 80, the gate thereof connected to the $\phi1$ signal.

Referring now to FIG. 8, there is illustrated a timing diagram for the signals $\phi1$ and $\phi2$, and the delayed signals $\phi2d$ and $\phi1d$. The main chop phases are $\phi1$ and $\phi2$ with the signals $\phi1d$ and $\phi2d$ slightly delayed versions of $\phi1$ and $\phi2$. The delayed signal $\phi1d$ is connected to the switches 50, 46 and 56 and the delayed signal $\phi2d$ is connected to switches 48 and 52 and to switch 54. The inverse versions of $\phi1d$ and $\phi2d$ are connected to switches 56 and 54, respectively.

Figure 9:
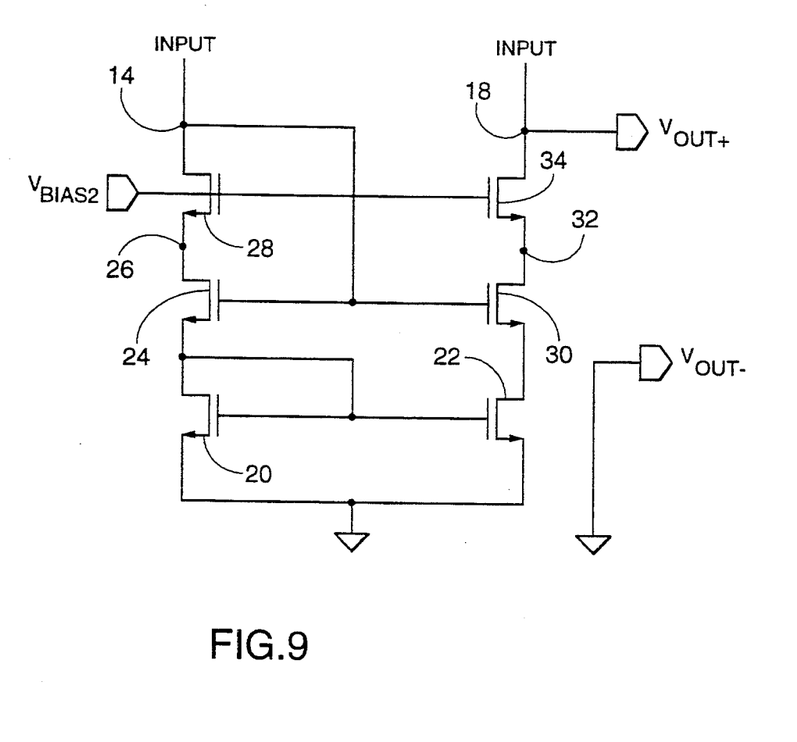
FIG. 9 illustrates an alternate embodiment for the triple cascoded active load of the present invention.

Referring now to FIG. 9, there is illustrated an alternate embodiment of the circuit of FIG. 4. In this configuration, the gate of transistor 20 is tied to the drain thereof, and the gate of transistor 24 is tied to the drain of transistor 28. Like the circuit of FIG. 4, this circuit will have all devices properly biased over a large variation of parameters, and has improved stability compared to the biasing circuit utilizing a level shift circuit. As compared to the circuit of FIG. 4, there is a slight disadvantage in this embodiment in that a slightly greater minimum output voltage will exist, due to the increased drain-to-source voltage of transistor 22, $V_{ds1} = V_{T1} + V_{ON1}$. Although the devices illustrated utilized N-channel transistors, it should be understood that P-channel transistors could be utilized as the load devices.

In summary, there has been provided a triple cascoded active load. The active load utilizes two feedback loops rather than a single level shifted loop. In one side of the current mirror, the lowest voltage transistor in the cascode configuration has the gate thereof connected to the drain of the next higher voltage transistor and the drain and gate of the highest level transistor connected together.

Although the preferred embodiment has been described in detail, it should be understood that various changes, substitutions and alterations can be made therein without departing from the spirit and scope of the invention as defined by the appended claims.

What is claimed is:

1. A cascoded active load for a differential to single-ended output amplifier stage, comprising:

a power node disposed at a predetermined voltage level;

a first input current node;

a second input current node, said second input current node comprising a voltage output node for the amplifier stage;

a first cascode leg having:

n transistors, each having a gate a source and a drain with a source/drain path disposed between said source and drain, said n transistors arranged with the source/drain paths thereof connected in a series configuration from said first input current node to said power node, the gate of each of said n transistors connected to either the drain of one of said n transistors that is disposed at a voltage level disposed a greater distance away from the voltage level of said power node or to an external bias voltage dedicated to that transistor such that each of said n transistors is operating in a saturated region, two of said n transistors connected in a ratioed cascode configuration with the gate of one of the two transistors therein connected to the drain of another of the two transistors that is disposed at a voltage level disposed a greater distance away from the voltage level of said power node, and the gate of said another of the two transistors connected to the external bias voltage, and no more than n−1 of said n transistors connected in a ratioed cascode configuration, the other of said n transistors having the gate thereof connected to the drain thereof; and a second cascode leg having n transistors arranged with the source/drain paths thereof connected in a series configuration between said second input current node and said power node, each of said n transistors in said second cascode leg corresponding in position to one of said n transistors in said first cascode leg, with the gates of the corresponding ones of said n transistors in said second cascode leg and said first cascode leg being connected together such that current through the corresponding one of said n transistors in said first cascode leg is mirrored to the corresponding one of said n transistors in said second output leg.

2. The active load of claim 1, wherein n is equal to 3.

3. The active load of claim 1, wherein each of said n transistors in said first cascode leg and said second cascode leg is comprised of an N-channel MOS transistor.

4. The active load of claim 1, and further comprising a chopping device, said chopping device having:

a first switch associated with said two of said n transistors connected in said ratioed cascode configuration for selectively connecting the gate of the one of the two transistors to the drain of said another of the two transistors in said ratioed cascode configuration at the voltage level that is disposed a greater distance away from the voltage level of said power node;

a second switch associated with said two of said n transistors connected in said ratioed cascode configuration and operable to selectively connect the gate of the one of the transistors to the drain of the one of the n transistors in said second cascode leg corresponding to the other of the transistors in said ratioed cascode configuration at the voltage level that is disposed a greater distance away from the voltage level of said power node, said second switch closed when said first switch is open and said first switch closed when said second switch is open;

each of the remaining ones of said n transistors in said first cascode leg that have the gate thereof connected to the drain thereof having a third switch disposed between the gate and the drain thereof and a fourth switch disposed between the gate thereof and the drain of said corresponding one of the n transistors in said second cascode leg, said third switch closed when said fourth switch is open, said third and fourth switches opening and closing when said respective first and second switches associated with said ratioed cascode configuration open and close;

said voltage output node connected to a dedicated intermediate node separate from said second input current node and a fifth switch for connecting said intermediate node to said second input current node when said first switch associated with said ratioed cascode configuration transistors and said third switch associated with said transistors in said first cascode leg having the gates thereof connected to the drains thereof are closed; and a sixth switch connected between said intermediate node and said first input current node and operable to be closed when said fifth switch is open; and external dock signals for driving said first, second, third, fourth, fifth and sixth switches in such a manner to chop an operation of said first and second cascode legs.

5. A cascoded active load for a differential-to-single ended output amplifier stage, comprising:

a power node disposed at a predetermined voltage level;

a first input current node;

a second input current node, said second input current node comprising a voltage output node for the amplifier stage;

a first cascode leg having first, second and third transistors, each of said first, second and third transistors have a gate, a source and a drain with a source/drain path between said source and drain, with the source/drain paths of said first, second and third transistors connected in a series connected configuration between said first input current node and said power node, with the source of said first transistor connected to said power node and the drain of said third transistor connected to said first input current node, with the source/drain path of said second transistor connected between the source of said third transistor and the drain of said first transistor, the gate of said first transistor connected to the drain of said second transistor, the gate of said third transistor connected to the drain of said third transistor and the gate of said second transistor connected to an external bias voltage; and a second cascode leg having first, second and third transistors corresponding to said first, second and third transistors, respectively, in said first cascode leg, with the source/drain paths thereof connected in a series configuration between said second input current node and said power node, with the source of said first transistor in said second cascode leg connected to said power node, the drain of said third transistor in said second cascode leg connected to said second input current node and the source/drain path of said second transistor in said second cascode leg connected between the source of said third transistor and the drain of said first transistor, in said second cascode leg, the gates of said first, second and third transistors in said second cascode leg, respectively, connected to the respective gates of said corresponding first, second and third transistors in said first cascode leg, such that current through the one of said first, second and third transistors in said first cascode leg is mirrored to the corresponding one of said first, second and third transistors in said second cascode leg.

6. The active load of claim 5, and further comprising:

a first switch associated with said first and second transistors in said first cascode leg for selectively connecting the gate of said first transistor to the drain of said second transistor;

a second switch associated with said first and second transistors in said second cascode leg and operable to selectively connect the gate of the said first transistor to the drain of said second transistor in said second cascode leg corresponding to said second transistor in said first cascode leg, said second switch closed when said first switch is open and said first switch closed when said second switch is open;

said third transistor in said first cascode leg having a third switch disposed between the gate and the drain thereof and a fourth switch disposed between the gate thereof and the drain of the corresponding said third transistor in said second cascode leg, said third switch closed when said fourth switch is open and said first switch is closed, and said third switch open when said fourth switch is closed and said first switch is open;

said voltage output node connected to a dedicated intermediate node separate from said second input current node and a fifth switch for connecting said intermediate node to said second input current node when said first switch and said third switch are closed;

a sixth switch connected between said intermediate node and said first input current node and operable to be closed when said fifth switch is open; and external clock signals for driving said first, second, third, fourth, fifth and sixth switches in such a manner to chop an operation of said first cascode leg and said second cascode leg.

7. A chopper stabilized active load, comprising:

a power node disposed at a predetermined voltage level;

a first input current node;

a second input current node;

an output terminal;

a first pair of switches having a first switch for connecting said first input current node to said output terminal and a second switch for connecting said second input current node to said output terminal;

a first cascode leg having n transistors, each having a gate, a source and a drain with a source/drain path disposed between said source and drain, said n transistors arranged with the source/drain paths thereof connected in a series configuration from said first input current node to said power node, such that adjacent ones of said n transistors have a connection between the source/drain paths thereof;

a second cascode leg having n transistors, each having a gate, a source and a drain with a source/drain path disposed between said source and drain, said n transistors arranged with the source/drain paths thereof connected in a series configuration from said second input current node to said power node, the gate of each of said n transistors in said second cascode leg connected to the gate of a corresponding ones of said n transistors in said first cascode leg;

a second pair of switches having a third switch connected between said first input current node and the gate of one of said n transistors in said first cascode leg and a fourth switch connected between the gate of said one transistor in said first cascode leg and said second input current node;

a third pair of switches having a fifth switch connected between the gate of another one of said n transistors in said first cascode leg different from said one transistor in said first cascode leg and the connection between the source/drain paths of two adjacent ones of said n transistors in said first cascode leg different from said another transistor, and a sixth switch connected between the gate of said another one of said n transistors in said first cascode leg and the connection between the source/drain paths of two adjacent ones of said n transistors in said second cascode leg that correspond to the two adjacent ones of said n transistors in said first cascode leg to which associated connection between the source/drain paths thereof said third switch is connected;

one of said n transistors in said first cascode leg not having the gate thereof connected to one of said third, fourth, fifth and sixth switches having the gate thereof connected to a fixed bias voltage to operate in a saturated region;

said first and second cascode legs and said first, second, third, fourth, fifth and sixth switches operating in a chopped configuration such that current through the corresponding one of said n transistors in said first cascode leg is mirrored to the corresponding one of said n transistors in said second cascode leg in a first mode and the current through the corresponding one of said n transistors in said second cascode leg is mirrored to the corresponding one of said n transistors in said first cascode leg in a second mode; and external dock signals for driving said first, second, third, fourth, fifth and sixth switches in such a manner to chop an operation of said first and second cascode legs in said first and second modes.

8. The active load of claim 7, wherein said third pair of switches is configured such that the connection between the two adjacent ones of said n transistors to which one side of said fifth switch is connected is at a voltage level disposed farther away from the voltage of said power node than the drain voltage of said another one of said n transistors to which gate the other side of said fifth switch is connected.

9. The active load of claim 7, wherein n is equal to three.

10. The active load of claim 7, wherein said another transistor in said first cascode leg and one of the two adjacent ones in said first cascode leg are disposed in a ratioed cascoded configuration when said fifth switch is closed.

* * * * *